US008013689B2

(12) United States Patent
Fan et al.

(10) Patent No.: US 8,013,689 B2
(45) Date of Patent: Sep. 6, 2011

(54) INTEGRATED CIRCUIT INDUCTOR WITH TRANSVERSE INTERFACES

(75) Inventors: Siqi Fan, San Diego, CA (US);
Hongming An, San Diego, CA (US)

(73) Assignee: Applied Micro Circuits Corporation,
San Diego, CA (US)

( * ) Notice: Subject to any disclaimer, the term of this patent is extended or adjusted under 35 U.S.C. 154(b) by 204 days.

(21) Appl. No.: 12/408,606

(22) Filed: Mar. 20, 2009

(65) Prior Publication Data
US 2010/0052817 A1    Mar. 4, 2010

Related U.S. Application Data

(63) Continuation-in-part of application No. 12/203,163, filed on Sep. 3, 2008.

(51) Int. Cl.
*H03H 7/01* (2006.01)
(52) U.S. Cl. ......... 333/175; 333/167; 333/177; 333/185
(58) Field of Classification Search ............... 333/167, 333/177, 181, 185, 175; 336/200, 232, 192, 336/223
See application file for complete search history.

(56) References Cited

U.S. PATENT DOCUMENTS 5,602,517 A * 2/1997 Kaneko et al. ............... 333/185
6,661,325 B2 * 12/2003 Suh et al. ..................... 336/200

* cited by examiner

*Primary Examiner* — Robert Pascal
*Assistant Examiner* — Kimberly Glenn
(74) *Attorney, Agent, or Firm* — Law Office of Gerald Maliszewski; Gerald Maliszewski

(57) ABSTRACT

An integrated circuit (IC) inductor structure is provided with transverse electrical interfaces. The inductor structure is formed on at least one IC circuit layer and has a first axis planar to a circuit layer surface, bisecting the inductor into opposite first and second sides. An input interface is formed on the circuit layer and connected to the inductor first side, parallel to a second axis, which is perpendicular to the first axis. An output interface is formed on the circuit layer and connected to the inductor second side, parallel to the second axis. In one aspect, the inductor has a center tap electrical interface parallel to the axis. In another aspect, the inductor includes a three-dimensional (3D) loop formed over a plurality of the circuit layers.

14 Claims, 7 Drawing Sheets

Fig. 1
*(PRIOR ART)*
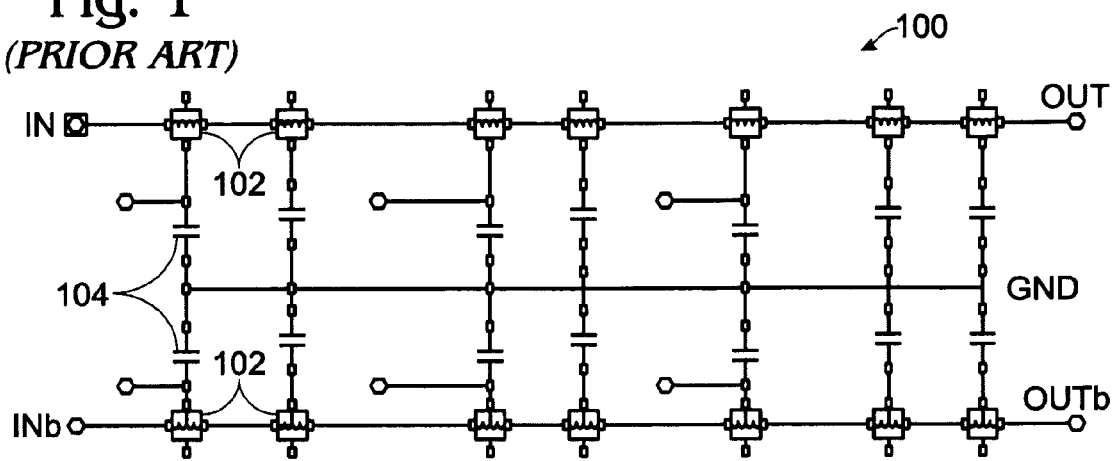
Fig. 2 *(PRIOR ART)*
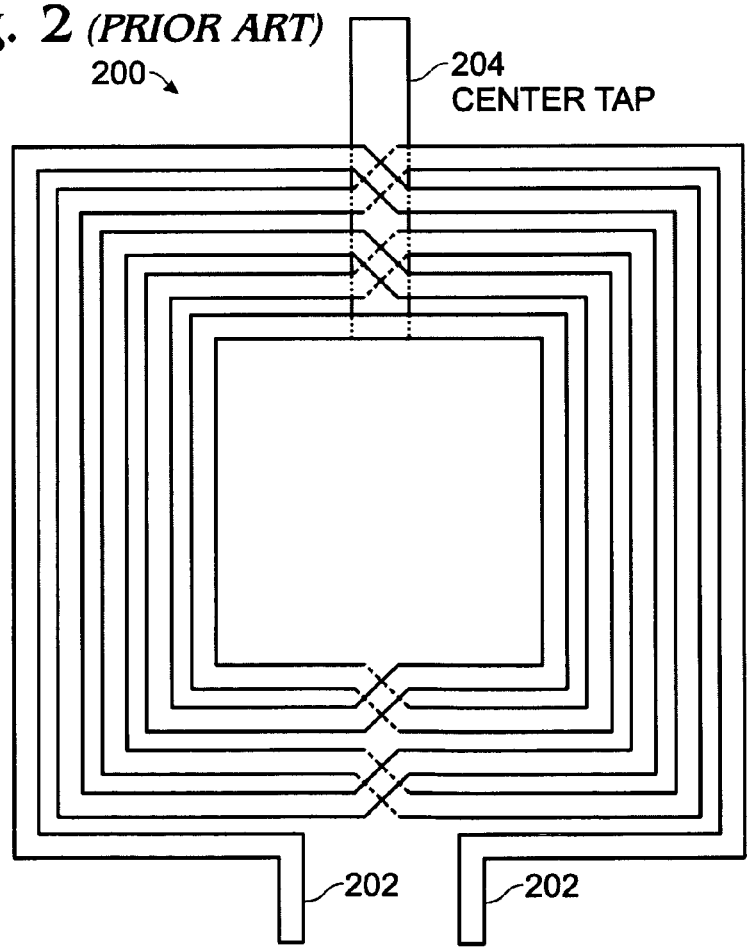

US 8,013,689 B2

INTEGRATED CIRCUIT INDUCTOR WITH TRANSVERSE INTERFACES

RELATED APPLICATIONS

This application is a continuation-in-part of a pending application entitled, INTEGRATED CIRCUIT MULTI-LEVEL INDUCTOR, invented by Siqi Fan, Ser. No. 12/203,163, filed Sep. 3, 2008, which is incorporated herein by reference.

BACKGROUND OF THE INVENTION

1. Field of the Invention

This invention generally relates to integrated circuit (IC) fabrication and, more particularly, to an inductor with transverse interfaces to minimize parasitics and size.

2. Description of the Related Art

Conventional digital systems fabricated on a single printed circuit board (PCB) or a collection of connected PCBs still often require analog circuitry. For example, analog circuits are often used in active buffers to boost a signal between communication nodes, or as an oscillator to create a reference signal. In both applications, inductors are used to peak or tune the signal to a desired frequency. The problem is that inductors tend to be large bulky components, and the electrical performance of bigger inductors (with higher quality (Q) factors and lower loss) is generally more desirable. The use of large inductors on PCBs results in higher costs, greater assembly complications, and a larger overall package size.

FIG. 1 is a schematic of a differential signal inductor-capacitor (LC) delay line (prior art). LC delay lines are often a component in analog circuits. Since large value capacitors are also bulky components, LC delay lines are especially problematic in IC fabrication. The delay line 100 is made by series connecting a plurality of inductors, and connecting the center tap of each inductor to a capacitor 104. Long interconnects between inductors are undesirable, as they create parasitics. The parasitics degrade loss and group delay, and make the circuit frequency dependent.

FIG. 2 is a plan of an inductor with a center tap, suitable for IC applications (prior art). The dotted lines represent a bridge between line segments that is enabled through vias to an adjacent circuit layer. The interconnects (input/output) 202 to the inductor 200 contribute to the overall space on an IC level that must be devoted to an inductor. Also shown is a center tap (tap) 204 from the center of the inductor, at a line length equally distanced from the input and output.

It would be advantageous if a PCB-style inductor could be designed especially for use in analog circuits that require low parasitics and a small size.

SUMMARY OF THE INVENTION

The present invention IC inductor has a smaller footprint than conventional designs and minimum connection parasitics due to the use of a transverse interface. The transverse interface permits greater space efficiency when series-connecting inductors, and it optimizes the overall circuit performance.

Accordingly, an integrated circuit (IC) inductor structure is provided with transverse electrical interfaces. The inductor structure is formed on at least one IC circuit layer and has a first axis planar to a circuit layer surface, bisecting the inductor into opposite first and second sides. An input interface is formed on the circuit layer and connected to the inductor first side, parallel to a second axis, which is perpendicular to the first axis. An output interface is formed on the circuit layer and connected to the inductor second side, parallel to the second axis. In one aspect, the inductor has a center tap electrical interface parallel to the first axis. In another aspect, the inductor includes a three-dimensional (3D) loop formed over a plurality of the circuit layers.

Additional details of the above-described inductor structure and an IC inductor-capacitor (LC) network are presented below.

BRIEF DESCRIPTION OF THE DRAWINGS

FIG. 1 is a schematic of a differential signal inductor-capacitor (LC) delay line (prior art).

FIG. 2 is a plan of an inductor with a center tap, suitable for IC applications (prior art).

DETAILED DESCRIPTION

Figure 3:
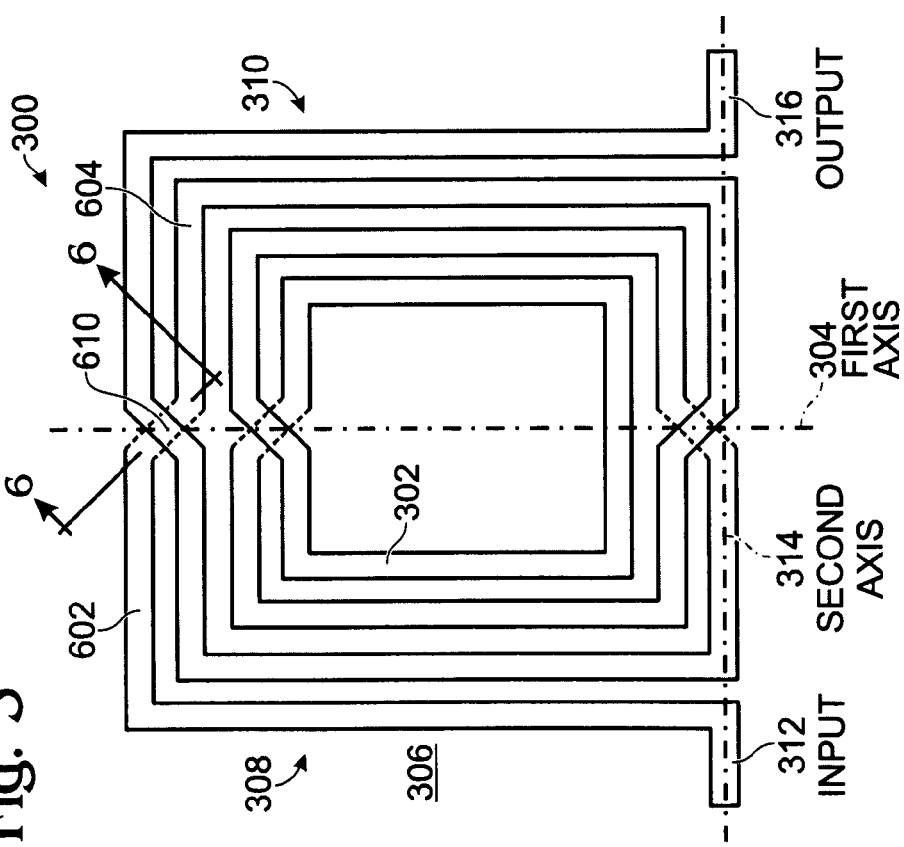
FIG. 3 is a plan view of an integrated circuit (IC) inductor structure with transverse electrical interfaces.

FIG. 3 is a plan view of an integrated circuit (IC) inductor structure with transverse electrical interfaces. The inductor structure 300 comprises an inductor 302 formed on at least one IC circuit layer having a first axis 304 planar to a circuit layer surface 306. The first axis 304 bisects the inductor 302 into a first side 308, which is opposite to a second side 310. An input interface 312 is formed on the circuit layer 306 and is connected to the inductor first side 308. The input interface 312 is parallel to a second axis 314, which is perpendicular to the first axis 304. An output interface 316 is formed on the circuit layer 306 and is connected to the inductor second side 310, parallel to the second axis 314.

It should be understood that an IC typically includes other circuits and features, not shown, as well as additional circuit layers or interlevels (not shown). Typically, a dielectric material (not shown), such as silicon oxide, is interposed between circuit layers of a metal such as copper or aluminum.

Figure 4:
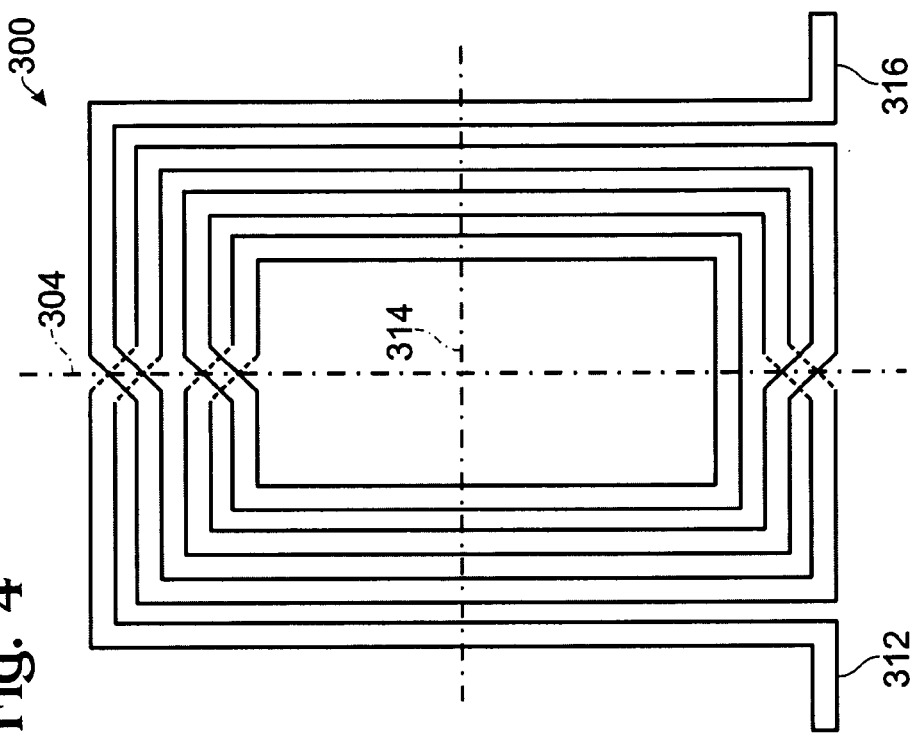
FIG. 4 is a plan view of rectangular shape inductor structure.

FIG. 4 is a plan view of rectangular shape inductor structure.

Figure 5:
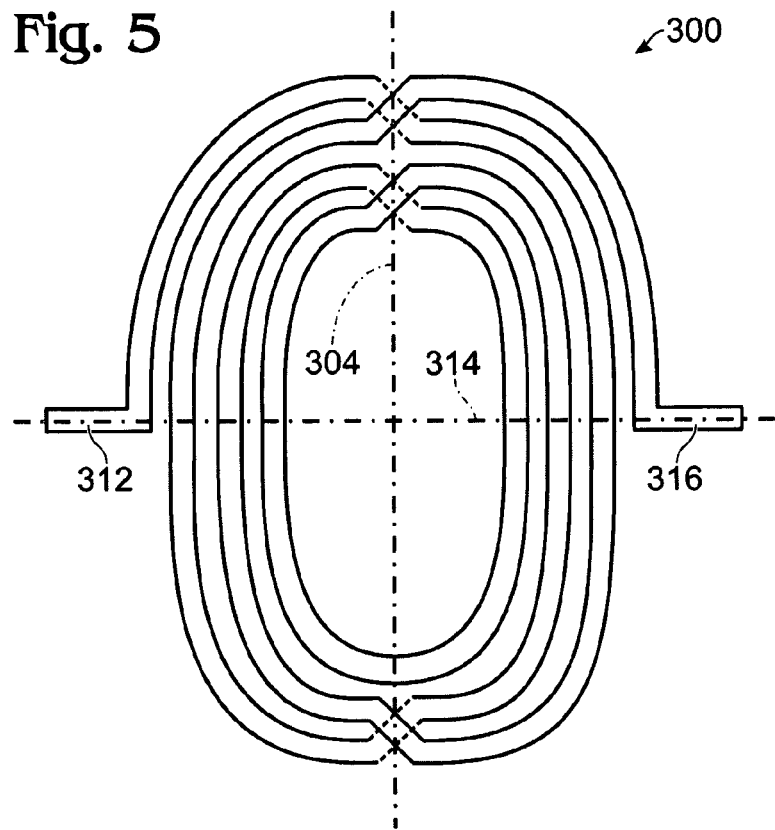
FIG. 5 is a plan view of a circular shape inductor structure.

FIG. 5 is a plan view of a circular shape inductor structure. FIG. 3 is an example of a square structure. Other examples of related shapes, not shown, include oval, hexagonal, and octagonal. It should be understood that the inductor is not limited to any particular shape or combination of shapes.

The inductor structures of FIGS. 3 through 5 all show at least one three-dimensional (3D) loops formed over a plurality of the circuit layers. The dotted lines represent a connection between loop segments made at a different circuit layer. For example, the different circuit layer can be a layer either overlying or underlying circuit layer 306. For increased inductance, each inductor is typically formed from a plurality of 3D loops, as shown.

Figure 6:
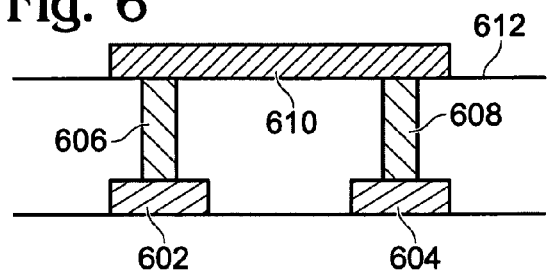
FIG. 6 is a partial cross-sectional view of the inductor structure of FIG. 3.

FIG. 6 is a partial cross-sectional view of the inductor structure of FIG. 3. Viewing FIGS. 6 and 3, an example of one inductor 3D loop includes a first partial loop portion 602 and a second partial loop portion 604 formed on first circuit layer 306. Vias 606 and 608 connect the first loop portion 602 and the second partial loop portion 604 through a bridge section 610 on a second circuit layer 612. Typically, the 3D loops are formed from outer core portions and inner core portions. In the example of FIG. 6, loop portion 602 is an outer core and loop portion 604 is an inner core. The terms inner and outer are relative, with the inner core being closer to the center of the inductor than the outer core portion.

Figure 8:
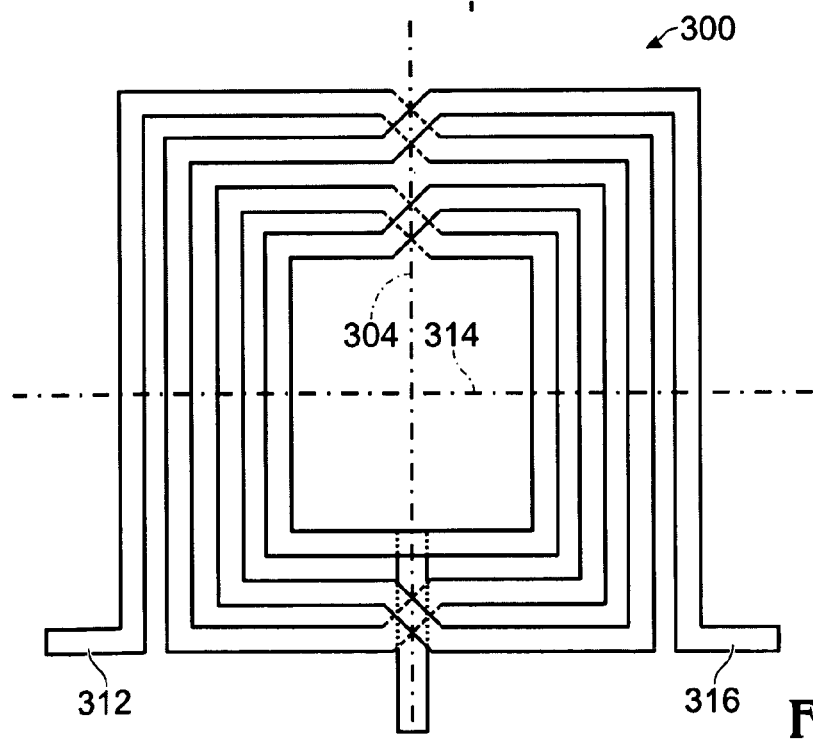
FIG. 8 is a plan view showing a second variation on the inductor structure of FIG. 3.

FIG. 8 is a plan view showing a second variation on the inductor structure of FIG. 3. In this aspect, a center tap electrical interface 800 is formed on the circuit layer 306, aligned in parallel with the first axis 304. In other aspect not shown, the center tap electrical interface is aligned in parallel with the second axis 314.

Figure 9:
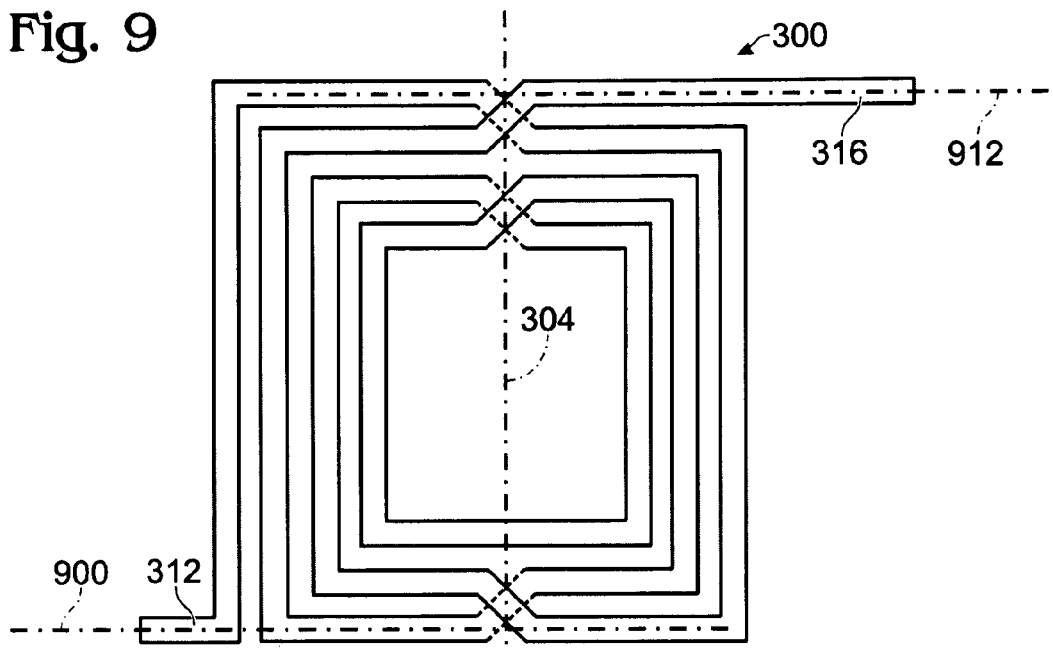
FIG. 9 is a plan view showing a third variation on the inductor structure of FIG. 3.

FIG. 9 is a plan view showing a third variation on the inductor structure of FIG. 3. In FIG. 3 the input and output interfaces are aligned along the same (second) axis. In this aspect, the input and output interfaces 312/316 are aligned with different axis 900/902 that are parallel to each other, and perpendicular to the first axis 314.

Figure 10:
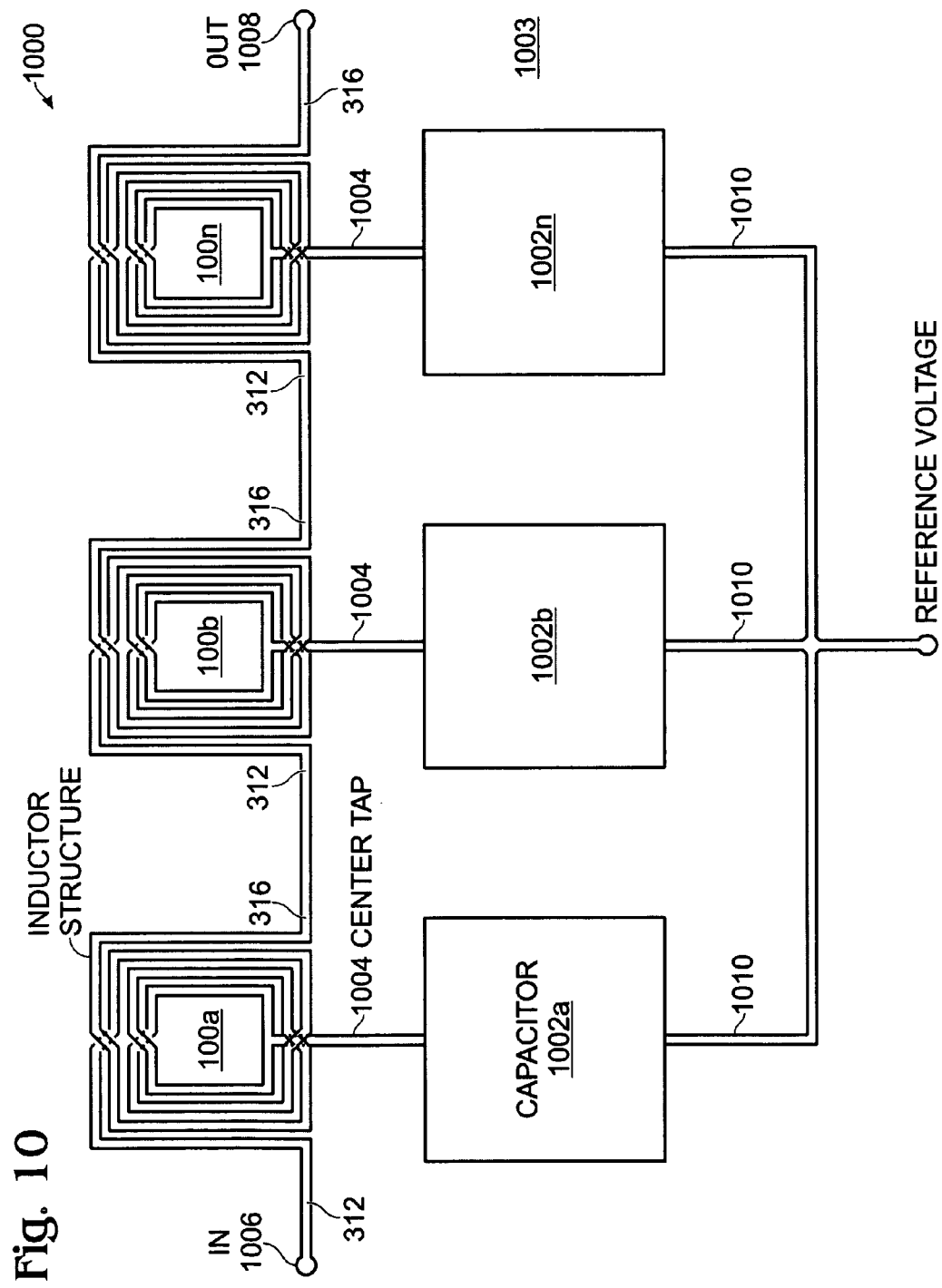
FIG. 10 is a schematic view of an IC inductor-capacitor (LC) network.

FIG. 10 is a schematic view of an IC inductor-capacitor (LC) network. The LC network 1000 comprises a plurality of adjacent inductor structures 100 formed on the at least one circuit layer. Each inductor structure is as described above in the explanation of FIGS. 3-6 and 8-10, and will not be repeated here in the interest of brevity. Inductor structures 100a through 100n are shown. In this example, n=3. However in general, n is not limited to any particular value. The LC network 1000 also includes a plurality of adjacent capacitors 1002. Capacitors 1002a through 1002n are shown. Each capacitor 1002 is formed on a circuit layer 1003 and has an input electrical interface 1004 connected to the center tap electrical interface of a corresponding inductor structure. The input and output electrical interfaces 312/316 of adjacent inductor structures are connected.

The LC network has an LC network input 1006 connected to the input electrical interface 312 of the first inductor structure 100a. An LC network output 1008 is connected to the output electrical interface 316 of a second inductor structure 100n. A reference voltage (e.g., ground) is connected the output electrical interface 1010 of each capacitor 1002.

Figure 11:
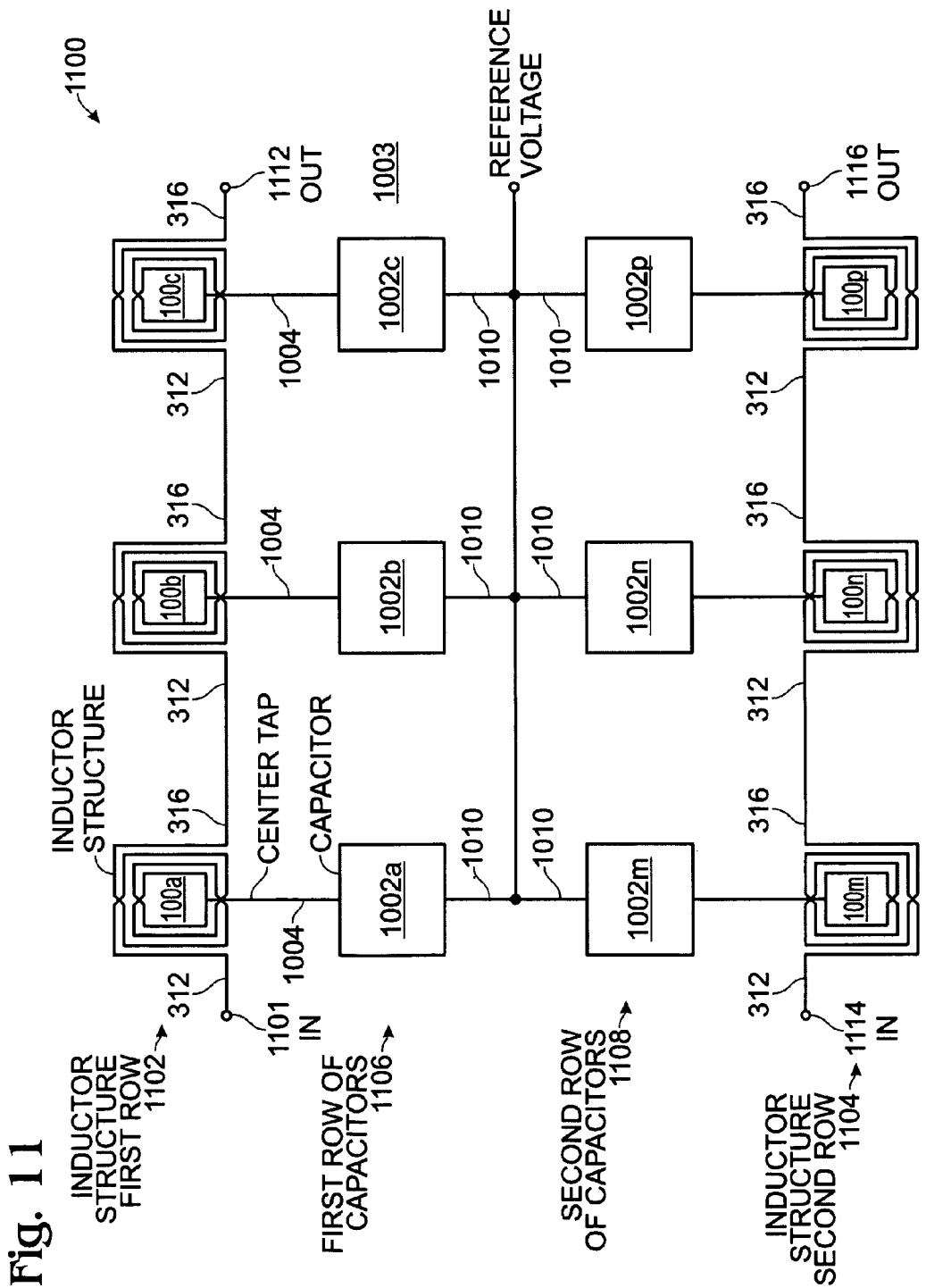
FIG. 11 is a schematic view of a differential LC network.

FIG. 11 is a schematic view of a differential LC network. The differential LC network 1100 comprises a first row 1102 of adjacent connected inductor structures 100, and a second row 1104 of adjacent connected inductor structures 100. Also included is a first row 1106 of capacitors 1002 interposed between the first row 1102 and second row 1104 of inductor structures 100, adjacent to and connected with corresponding inductor structures in the first row. That is, inductor structure 100a is connected to capacitor 1002a, and inductor structure 10b is connected to capacitor 1002b, etc. A second row of capacitors 1108 is interposed between the first row of capacitors 1106 and the second row of inductor structures 1104, adjacent to, and connected with corresponding inductor structures 100 in the second row 1104.

An LC network first differential input 1101 is connected to the input electrical interface 312 of a first inductor structure 100a in the first row 1102. An LC network first differential output 1112 is connected to the output electrical interface 316 of a second inductor structure 100n in the first row 1102. An LC network second differential input 1114 is connected to the input electrical interface 312 of a third inductor structure 100m in the second row 1104. An LC network second differential output 1116 is connected to the output electrical interface 316 of a fourth inductor structure 100p in the second row 1104. A reference voltage connected the output electrical interface 1010 of each capacitor 1002 in the first and second rows of capacitors.

Figure 12:
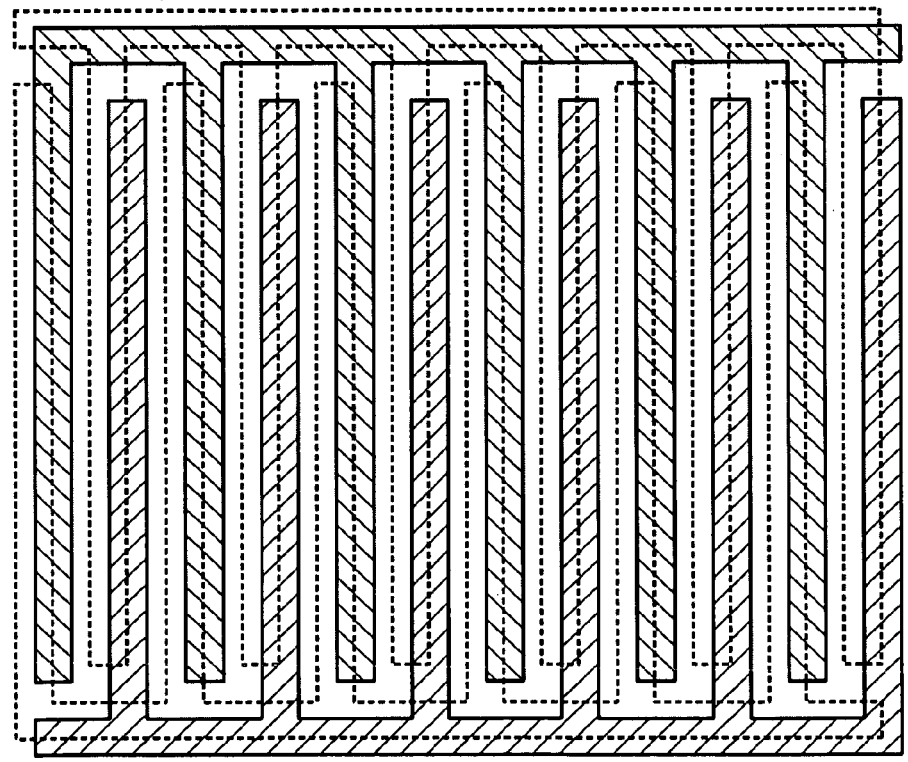
FIG. 12 plan view of a multilayer interdigital capacitor (prior art).

FIG. 12 plan view of a multilayer interdigital capacitor (prior art). Such a capacitor would be suitable for use in the LC networks of FIGS. 10 and 11. However, it should be understood the circuits of FIGS. 10 and 11 are not limited to any particular capacitor design.

Figure 7:
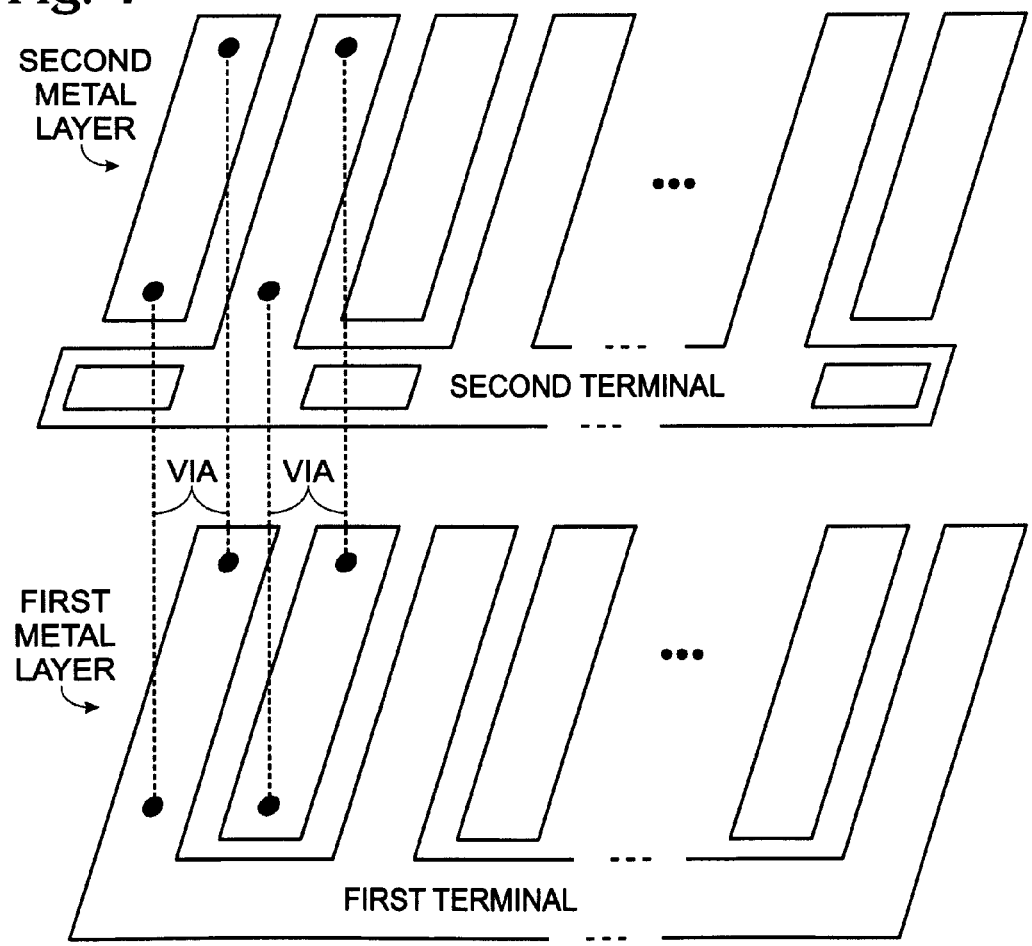
FIG. 7 is perspective view of an interdigital capacitor with self-canceling inductance.

FIG. 7 is perspective view of an interdigital capacitor with self-canceling inductance. Such a capacitor would be suitable for use in the LC networks of FIGS. 10 and 11. A complete description of this capacitor can be found in pending application Ser. No. 12/351,822, entitled INTERDIGITAL CAPACITOR WITH SELF-CANCELING INDUCTANCE, invented by Simon Willard, and filed on Jan. 10, 2009. The above-mentioned application is incorporated herein by reference.

A traverse interface inductor and associated LC network have been provided. Examples using specific number of circuit layers and routing paths have been given to illustrate the invention. However, the invention is not limited to just these examples. Other variations and embodiments of the invention will occur to those skilled in the art.

We claim:

1. An integrated circuit (IC) inductor structure with transverse electrical interfaces, the inductor structure comprising:
   an inductor formed on a first IC circuit layer having an first axis planar to a circuit layer surface, bisecting the inductor into opposite first and second sides;
   an input interface formed on the first circuit layer, connected to the inductor first side, parallel to a second axis, and perpendicular to the first axis;
   an output interface formed on the first circuit layer, connected to the inductor second side and parallel to the second axis; and,
   wherein the inductor includes a plurality of 3D loops formed on the first circuit layer and a second circuit layer, each of the 3D loops forming an outer core portion and an inner core portion on the first circuit layer.

2. The inductor structure of claim 1 wherein the inductor has a plan-perspective shape selected from a group consisting of circular, square, rectangular, oval, hexagonal, and octagonal.

3. The inductor structure of claim 1 wherein each of the inductor 3D loops includes:
   a first partial loop portion and a second partial loop portion formed on the first circuit layer; and,
   vias connecting the first and second partial loop portions through a bridge section on the second circuit layer.

4. The inductor structure of claim 1 further comprising:
   a center tap electrical interface formed on the first circuit layer, aligned in parallel with the first axis.

5. An integrated circuit (IC) inductor-capacitor (LC) network, the LC network comprising:
   an plurality of adjacent inductor structures formed on a first circuit layer, each of the inductor structures having an first axis planar to a circuit layer surface, bisecting each of the inductor structures into opposite first and second sides, an input interface formed on the first circuit layer connected to the inductor first side, parallel to a second axis, and perpendicular to the first axis, an output interface formed on the first circuit layer connected to the inductor second side and parallel to the second axis, and a center tap electrical interface formed on the first circuit layer aligned in parallel with the first axis;

a plurality of adjacent capacitors, each of the capacitors formed on the first circuit layer and having an input electrical interface connected to the center tap electrical interface of a corresponding one of the inductor structures; and, wherein the input and output electrical interfaces of adjacent inductor structures are connected.

6. The LC structure of claim 5 wherein each of the inductor structures includes a three-dimensional (3D) loop formed on the first circuit layer and a second circuit layer.

7. The LC structure of claim 6 wherein each of the inductor structures includes a plurality of 3D loops, each of the 3D loops forming an outer core portion and an inner core portion on the first circuit layer.

8. The LC structure of claim 6 wherein each inductor 3D loop includes:
    a first partial loop portion and a second partial loop portion formed on the first circuit layer; and,
    vias connecting the first and second partial loop portions through a bridge section on a second circuit layer.

9. The LC structure of claim 5 wherein the inductor has a plan-perspective shape selected from a group consisting of circular, square, rectangular, oval, hexagonal, and octagonal.

10. The LC structure of claim 5 wherein each of the capacitors has an axis planar to the circuit layer surface, bisecting each capacitor into opposite first and second sides, and perpendicular to the first axes, an input electrical interface connected to each of the capacitor first sides, and an output electrical interface connected to each of the capacitor second sides.

11. The LC structure of claim 10 further comprising:
    an LC network input connected to the input electrical interface of a first inductor structure of the plurality of inductor structures;
    an LC network output connected to the output electrical interface of a second inductor structure of the plurality of inductor structures; and,
    a reference voltage connected the output electrical interface of each of the capacitors.

12. The LC structure of claim 10 wherein the plurality of inductor structures includes:
    a first row of adjacent connected inductor structures;
    a second row of adjacent connected inductor structures;
    wherein the plurality of capacitors includes:
    a first row of capacitors interposed between the first and second rows of inductor structures, adjacent to and connected with corresponding one of the inductor structures in the first row;
    a second row of capacitors interposed between the first row of capacitors and the second row of inductor structures, adjacent to and connected with corresponding one of the inductor structures in the second row;
    an LC network first differential input connected to the input electrical interface of a first inductor structure in the first row;
    an LC network first differential output connected to the output electrical interface of a second inductor structure in the first row;
    an LC network second differential input connected to the input electrical interface of a third inductor structure in the second row;
    an LC network second differential output connected to the output electrical interface of a fourth inductor structure in the second row; and,
    a reference voltage connected the output electrical interface of each of the capacitors in the first and second rows of capacitors.

13. An integrated circuit (IC) inductor structure with transverse electrical interfaces, the inductor structure comprising:
    an inductor formed on a first IC circuit layer having an first axis planar to a circuit layer surface, bisecting the inductor into opposite first and second sides;
    an input interface formed on the first circuit layer, connected to the inductor first side, parallel to a second axis, and perpendicular to the first axis;
    an output interface formed on the first circuit layer, connected to the inductor second side and parallel to the second axis;
    wherein the inductor includes a 3D loop formed on the first circuit layer and a second circuit layer, including:
        a first partial loop portion and a second partial loop portion formed on the first circuit layer; and,
        vias connecting the first and second partial loop portions through a bridge section on the second circuit layer.

14. An integrated circuit (IC) inductor structure with transverse electrical interfaces, the inductor structure comprising:
    an inductor formed on a first IC circuit layer having an first axis planar to a circuit layer surface, bisecting the inductor into opposite first and second sides;
    an input interface formed on the first circuit layer, connected to the inductor first side, parallel to a second axis, and perpendicular to the first axis;
    an output interface formed on the first circuit layer, connected to the inductor second side and parallel to the second axis; and,
    a center tap electrical interface formed on the first circuit layer, aligned in parallel with the first axis.

* * * * *